United States Patent
Hong et al.

(10) Patent No.: US 8,077,238 B2
(45) Date of Patent: Dec. 13, 2011

(54) WIDE DYNAMIC RANGE SENSOR HAVING A PINNED DIODE WITH MULTIPLE PINNED VOLTAGES

(75) Inventors: Sungkwon C. Hong, Boise, ID (US); Alex Krymski, La Crescenta, CA (US)

(73) Assignee: Aptina Imaging Corporation, George Town (KY)

( * ) Notice: Subject to any disclaimer, the term of this patent is extended or adjusted under 35 U.S.C. 154(b) by 367 days.

(21) Appl. No.: 12/405,351

(22) Filed: Mar. 17, 2009

(65) Prior Publication Data

US 2009/0190014 A1     Jul. 30, 2009

Related U.S. Application Data

(62) Division of application No. 11/448,688, filed on Jun. 8, 2006, now Pat. No. 7,517,717, which is a division of application No. 10/921,226, filed on Aug. 19, 2004, now Pat. No. 7,238,977.

(51) Int. Cl.
*H04N 3/14* (2006.01)
*H04N 5/335* (2011.01)
*H01L 31/062* (2006.01)
*H01L 31/113* (2006.01)

(52) U.S. Cl. ......... 348/299; 348/294; 348/296; 257/292
(58) Field of Classification Search ............... 348/294, 348/296–299; 257/291, 292
See application file for complete search history.

(56) References Cited

U.S. PATENT DOCUMENTS

| | | | |
|---|---|---|---|
| 5,446,297 A * | 8/1995 | Lee | 257/223 |
| 5,903,021 A | 5/1999 | Lee et al. | |
| 6,011,251 A | 1/2000 | Dierickx et al. | |
| 6,115,065 A | 9/2000 | Yadid-Pecht et al. | |
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,882,022 B2 | 4/2005 | Hynecek | |
| 2004/0021058 A1 * | 2/2004 | Drowley et al. | 250/208.1 |
| 2004/0188727 A1 * | 9/2004 | Patrick | 257/292 |
| 2005/0051701 A1 | 3/2005 | Hong | |
| 2005/0083421 A1 | 4/2005 | Berezin et al. | |
| 2005/0087782 A1 * | 4/2005 | Rhodes et al. | 257/292 |

* cited by examiner

*Primary Examiner* — Daniel M Pasiewicz

(57) ABSTRACT

A pixel cell has controlled photosensor anti-blooming leakage by having dual pinned voltage regions, one of which is used to set the anti-blooming characteristics of the photosensor. Additional exemplary embodiments also employ an anti-blooming transistor in conjunction with the dual pinned photosensor. Other exemplary embodiments provide a pixel with two pinned voltage regions and two anti-blooming transistors. Methods of fabricating the exemplary pixel cells are also disclosed.

8 Claims, 17 Drawing Sheets

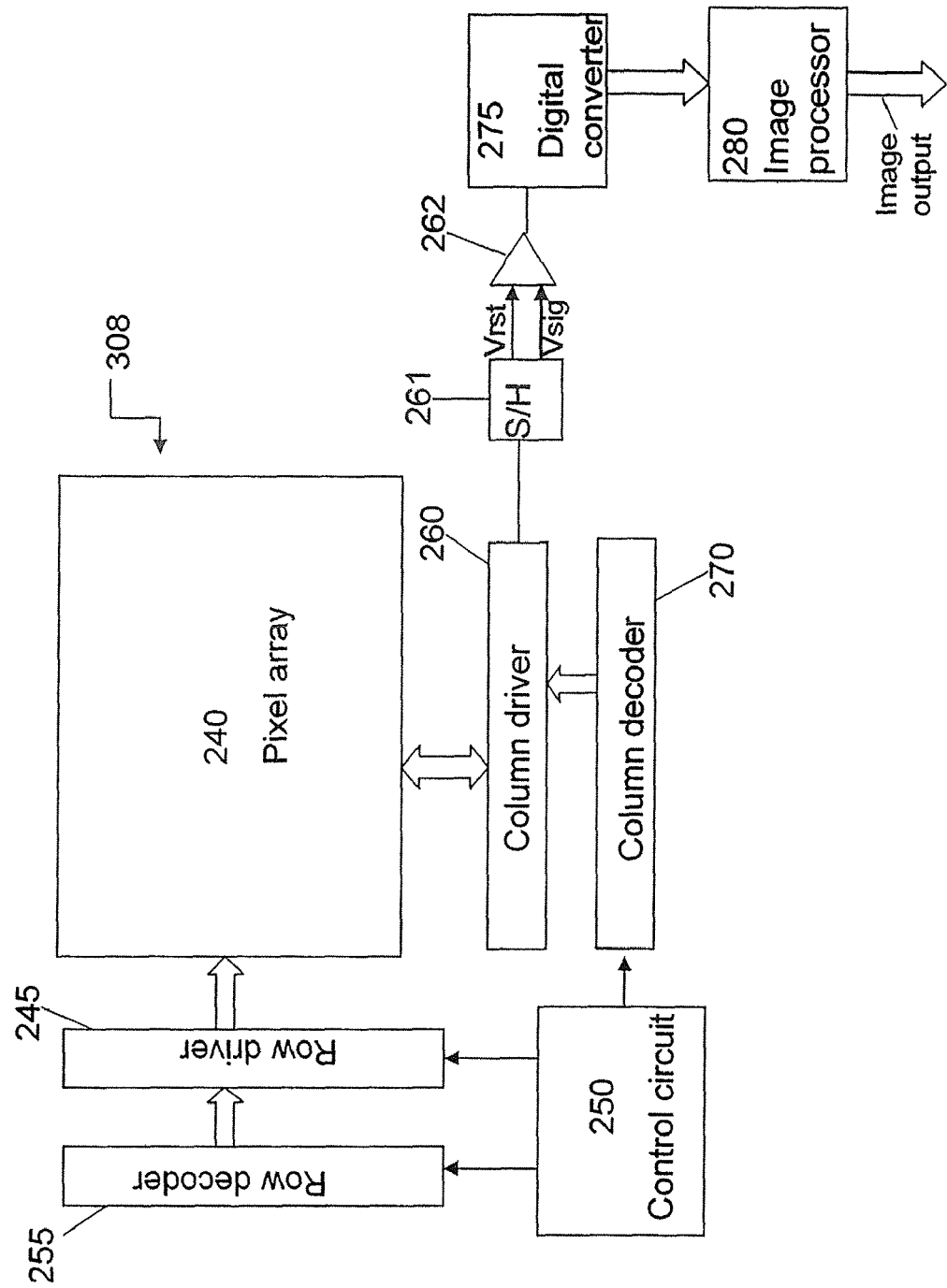

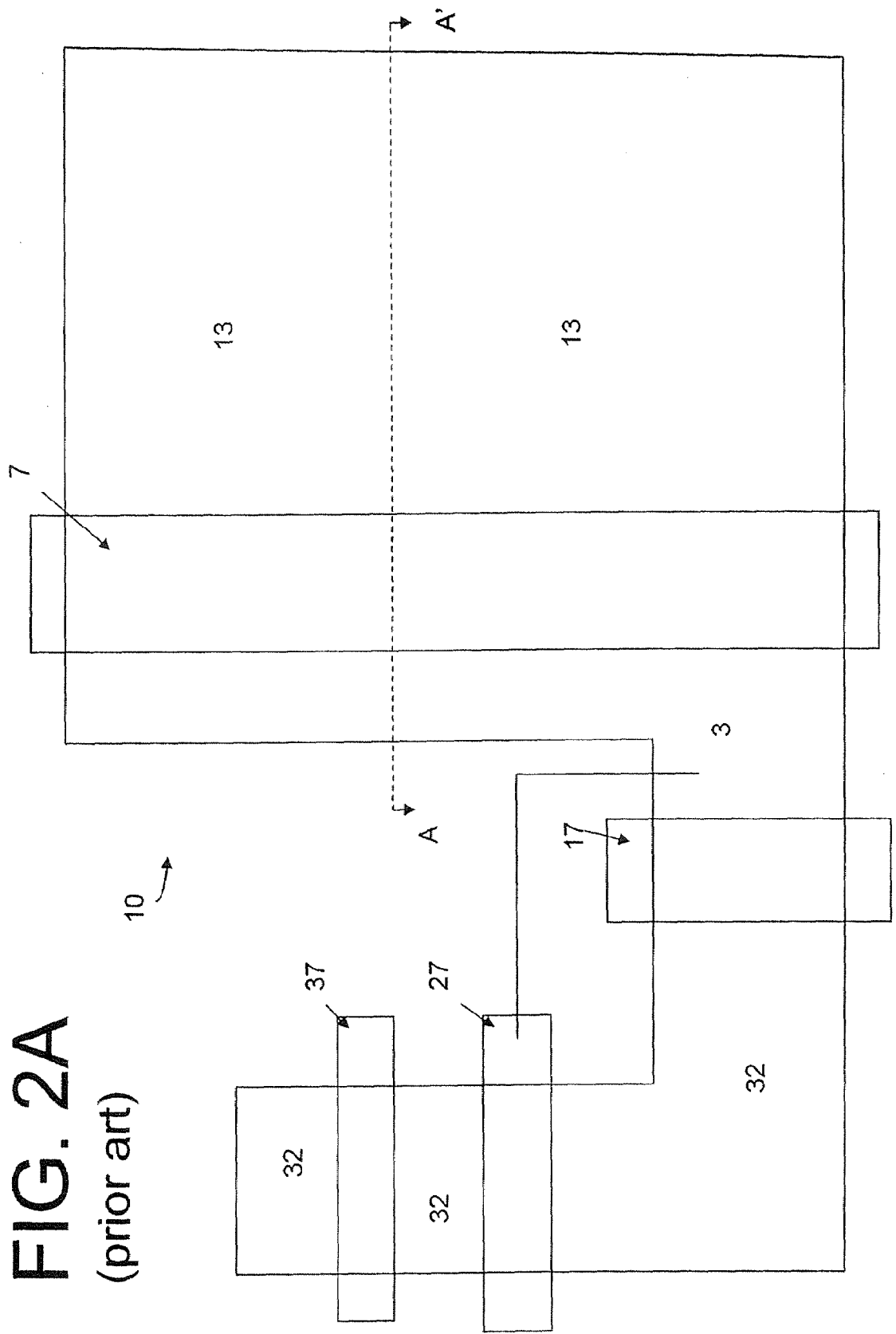

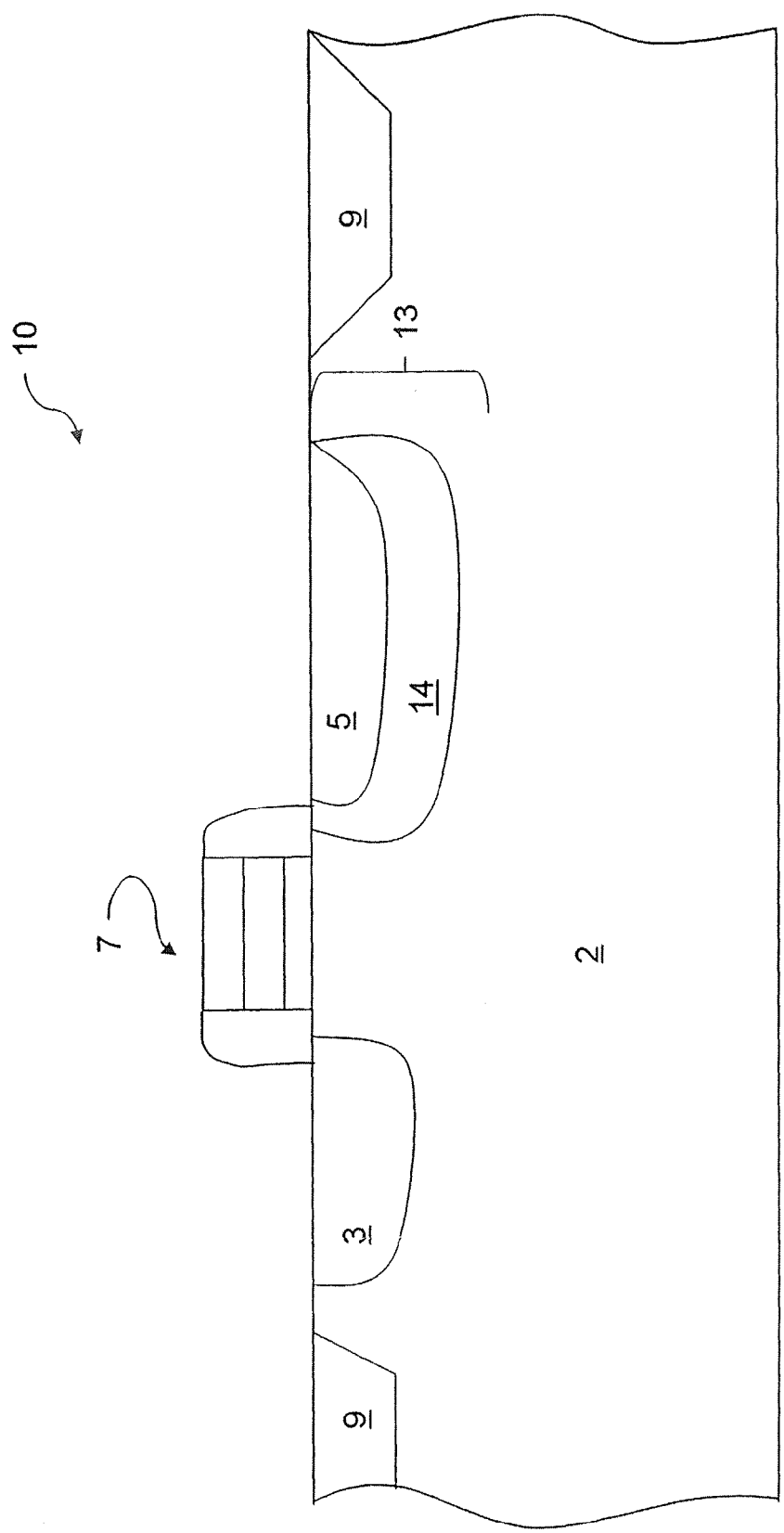

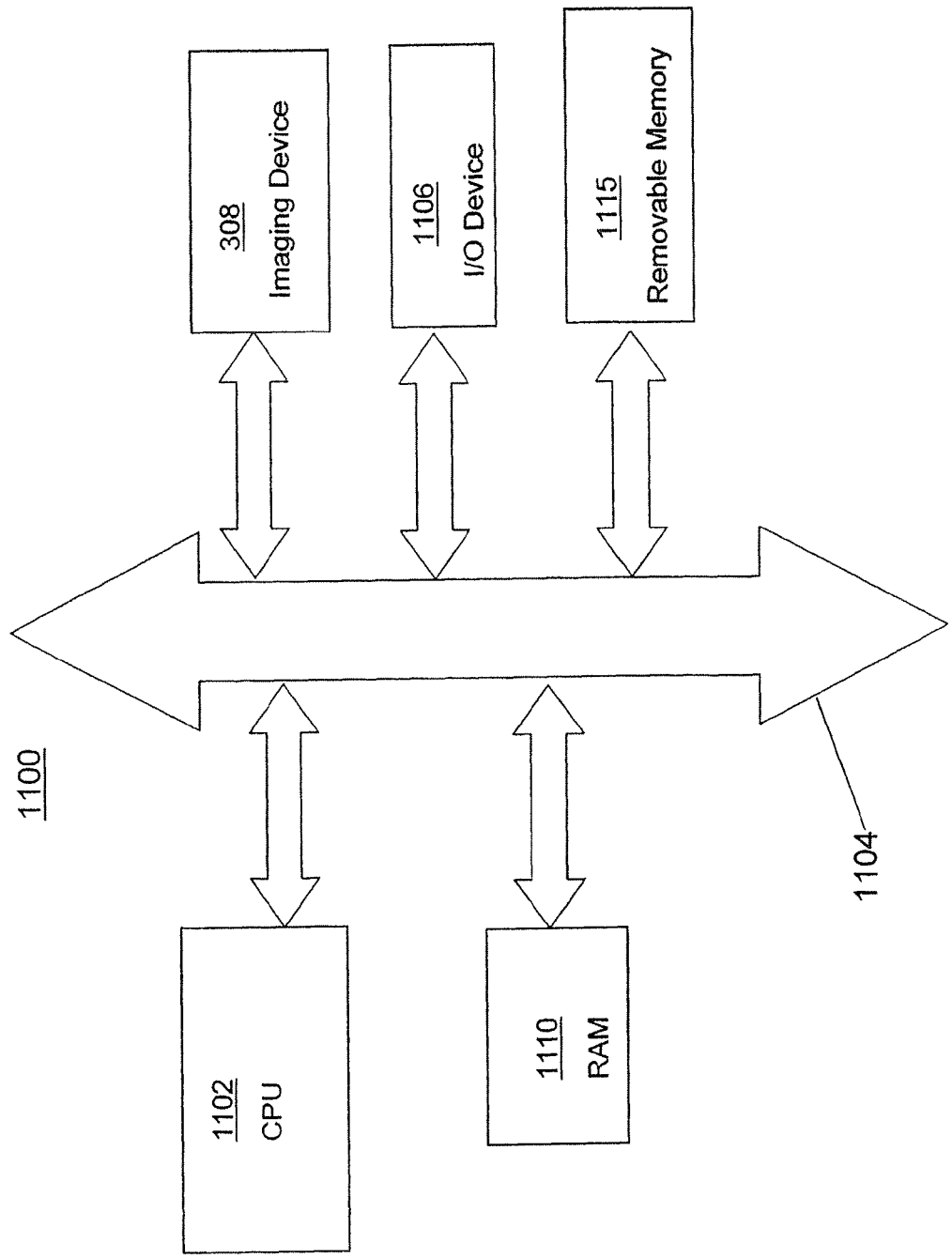

WIDE DYNAMIC RANGE SENSOR HAVING A PINNED DIODE WITH MULTIPLE PINNED VOLTAGES

CROSS-REFERENCE TO RELATED APPLICATION

This application is a divisional of U.S. patent application Ser. No. 11/448,688, filed on Jun. 8, 2006 now U.S. Pat. No. 7,517,717, which is a divisional of U.S. patent application Ser. No. 10/921,226, filed on Aug. 19, 2004, now U.S. Pat. No. 7,238,977, both of which are incorporated herein by reference in their entireties.

FIELD OF THE INVENTION

The present invention relates to the field of semiconductor devices and, in particular, to a photodiode for improving the dynamic range and fixed pattern noise characteristics of a pixel sensor cell.

BACKGROUND OF THE INVENTION

A CMOS imager includes a focal plane array of pixel cells, each cell includes a photosensor, for example, a photogate, photoconductor or a photodiode overlying a substrate for producing a photo-generated charge in a doped region of the substrate. In a CMOS imager, the active elements of a pixel cell, for example a four transistor pixel, perform the necessary functions of (1) photon to charge conversion; (2) transfer of charge to the floating diffusion region; (3) resetting the floating diffusion region to a known state before the transfer of charge to it; (4) selection of a pixel cell for readout; and (5) output and amplification of a signal representing a reset voltage and a pixel signal voltage based on the photo converted charges. The charge at the floating diffusion region is converted to a pixel output voltage by a source follower output transistor.

FIG. 1 illustrates a block diagram of a CMOS imager device 308 having a pixel array 240 with each pixel cell being constructed as described above. Although not shown in FIG. 1, pixel array 240 includes a plurality of pixels arranged in a predetermined number of columns and rows. The pixels of each row in array 240 are all turned on at the same time by a row select line (not shown), and the pixels of each column are selectively output by respective column select lines (not shown). A plurality of row and column lines are provided for the entire array 240. The row lines are selectively activated by the row driver 245 in response to row address decoder 255 and the column select lines are selectively activated by the column driver 260 in response to column address decoder 270. Thus, a row and column address is provided for each pixel.

The CMOS imager is operated by a control circuit 250 that controls address decoders 255, 270, for selecting the appropriate row and column lines for pixel readout, and row and column driver circuitry 245, 260, which apply driving voltages to the drive transistors of the selected row and column lines. The pixel column signals, which typically include a pixel reset signal Vrst and a pixel image signal Vsig for each pixel are read by sample and hold circuitry ("S/H") 261 associated with the column driver 260. A differential signal Vrst-Vsig is produced for each pixel and is amplified by amplifier 262 and digitized by analog-to-digital converter 275. The digital signals are fed to an image processor 280 that forms a digital image output.

Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,3666, 326,652, 6,204,524, and 6,333,205, all assigned to Micron Technology, Inc. The disclosures of each of the forgoing patents are hereby incorporated by reference herein in their entirety.

A schematic diagram of a conventional CMOS APS (active pixel sensor) four-transistor (4T) pixel cell 10 is illustrated in FIGS. 2A and 2B. FIG. 2A is a top-down view of the cell 10; FIG. 2B is a cross-sectional view of the cell 10 of FIG. 2A, taken along line A-A'. The illustrated cell 10 includes a pinned photodiode 13 as a photosensor. Alternatively, the CMOS cell 10 may include a photogate, photoconductor or other photon-to-charge converting device, in lieu of the pinned photodiode 13, as the initial accumulating area for photo-generated charge. The photodiode 13 includes a p+ surface accumulation layer 5 and an underlying n− accumulation region 14 formed in a p-type semiconductor substrate layer 2.

The pixel cell 10 of FIG. 1 has a transfer gate 7 for transferring photocharges generated in the n− accumulation region 14 to a floating diffusion region 3 (i.e., storage region). The floating diffusion region 3 is further connected to a gate 27 of a source follower transistor. The source follower transistor provides an output signal to a row select access transistor having a gate 37 for selectively gating the output signal to a terminal (not shown). A reset transistor having a gate 17 resets the floating diffusion region 3 to a specified charge level before each charge transfer from the n− region 14 of the photodiode 13.

The illustrated pinned photodiode 13 is formed on a p-type substrate 2. It is also possible, for example, to have a p-type substrate base beneath p-wells in an n-type epitaxial layer. The n− accumulation region 14 and p+ accumulation region 5 of the photodiode 13 are spaced between an isolation region 9 and a charge transfer gate 7. The illustrated, conventional pinned photodiode 13 has a p+/n−/p− structure.

The photodiode 13 has two p-type regions 5, 2 having the same potential so that the n− accumulation region 14 is fully depleted at a pinning voltage ($V_{pin}$). The photodiode 13 is termed "pinned" because the potential in the photodiode 13 is pinned to a constant value, $V_{pin}$, when the photodiode 13 is fully depleted. When the transfer gate 7 is conductive, photo-generated charge is transferred from the charge accumulating n− region 14 to the floating diffusion region 3.

The isolation region 9 is typically formed using a conventional shallow trench isolation (STI) process or by using a Local Oxidation of Silicon (LOCOS) process. The floating diffusion region 3 adjacent to the transfer gate 7 is commonly n-type. A translucent or transparent insulating layer (not shown) may also be formed over the pixel cell 10.

Additionally, impurity doped source/drain regions 32, having n-type conductivity, are provided on either side of the transistor gates 17, 27, 37. Conventional processing methods are used to form contacts (not shown) in an insulating layer to provide an electrical connection to the source/drain regions 32, the floating diffusion region 3, and other wiring to connect to gates and form other connections in the cell 10.

Image sensors, such as an image sensor employing the conventional pixel cell 10, have a characteristic dynamic range. Dynamic range refers to the range of incident light that can be accommodated by an image sensor in a single frame of pixel data. It is desirable to have an image sensor with a high dynamic range to image scenes that generate high dynamic range incident signals, such as indoor rooms with windows to the outside, outdoor scenes with mixed shadows and bright sunshine, night-time scenes combining artificial lighting and shadows, and many others.

The dynamic range for an image sensor is commonly defined as the ratio of its largest non-saturating signal to the standard deviation of its noise under dark conditions. The dynamic range is limited on an upper end by the charge saturation level of the sensor, and on a lower end by noise imposed limitations and/or quantization limits of the analog-to-digital converter used to produce the digital image. When the dynamic range of an image sensor is too small to accommodate the variations in light intensities of the imaged scene, e.g. by having a low saturation level, image distortion occurs.

Another problem associated with charge generation in conventional pixel cells occurs when the incident light captured and converted into charge during an integration period is greater than the capacity of the photosensor. For example, FIG. 4 illustrates the charge ("Q") readout possible for a conventional pixel cell 10, having a photosensor, over time. At a time, $t_0$ the integration period for the pixel cell 10 is started. A pixel cell's maximum charge capacity $Q_s$ may be reached at a relatively low level of illumination, which causes the pixel cell to be easily saturated, thereby limiting the dynamic range of the pixel. Once the sensing region (photodiode 13) reaches saturation, (time $t_1$) the cell has generated $Q_S$ charge. Any additional photon-to-charge conversion will require some charge leakage to escape the photodiode 13 region. Often times this leakage causes charges to migrate to adjacent pixel cells causing cross-talk.

Additionally, when the charges generated during an integration period are output from the photosensor during sampling, a small amount of charge is left over in the photosensor. The residual charge may cause the photosensor to exceed its maximum capacity, thereby causing excess charge to overflow to adjacent pixels. This undesirable phenomenon is known as blooming and results in a number of vertical and/or horizontal streaks in the resultant output image.

One solution that has been suggested to overcome the above problems, is to provide the pixel cell 50 with an anti-blooming transistor 47, as shown in FIG. 3 and as described in a U.S. Provisional Application No. 60/243,898. As shown in FIG. 3, the pixel cell 50 is similar to the 4T pixel cell 10 of FIGS. 2A and 2B, but has an additional transistor 47 for reducing the blooming phenomenon just described. During an integration period for the pixel cell 50, when the sensing region 41 (which may be any of a photodiode, photogate, or photoconductor) becomes saturated with charge, the anti-blooming (AB) transistor 47 transfers some of the excess charge to a drain area 49 associated with the AB transistor 47. The proposed design is effective for increasing the dynamic range over the conventional pixel cell 10, however, the proposed pixel cell 50 also has at least one drawback.

The drawback associated with the FIG. 3 cell 50, is that CMOS transistors have a high deviation in threshold voltage $V_{th}$ from wafer to wafer, and often from transistor to transistor. The deviation is created to a large extent by the gate oxide layer. For example, the gate oxide layer can assimilate floating charges that make it difficult to precisely control operating transistor characteristics. This deviation leads to an uncertainty in the amount of charge stored from pixel cell to pixel cell since the threshold voltage $V_{th}$ of each transistor, including the anti-blooming transistor, could vary. The variance of charge storage from pixel cell to pixel cell leads to fixed pattern noise (FPN) in an imager array resulting in diminished image quality because of the non-uniformity of barrier heights between pixels.

An optimal pixel cell has a high dynamic range and low fixed pattern noise. There is needed, therefore, a pixel cell having improved saturation response and lower potential for blooming, but also having fixed pattern noise at least as low as a conventional 4T pixel. There is also a need for a simple method of fabricating the desired pixel.

BRIEF SUMMARY OF THE INVENTION

Exemplary embodiments of the invention provide a pixel cell having a high dynamic range with low fixed pattern noise. The pixel cell has controlled photosensor anti-blooming leakage by having dual pinned voltage regions, one of which is be used to set the anti-blooming characteristics of the photosensor. Additional exemplary embodiments also employ an anti-blooming transistor in conjunction with the dual pinned photosensor.

According to an exemplary method of fabricating embodiments, implanting techniques provide two pinned voltage regions for the photosensor, one of which may be used to set the saturation limit of the photosensor.

Other exemplary embodiments provide a pixel with two pinned voltage regions and two anti-blooming transistors.

BRIEF DESCRIPTION OF THE DRAWINGS

These and other features and advantages of the invention will be better understood from the following detailed description, which is provided in connection with the accompanying drawings, in which:

FIG. 1 is a block diagram of an imaging device;

FIG. 2A is a top-down view of a conventional four-transistor (4T) pixel cell;

FIG. 2B is a cross-sectional view of the conventional four-transistor pixel cell of FIG. 2A, taken along line A-A';

FIG. 16 shows a processor system incorporating at least one imager device constructed in accordance with an embodiment of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Although the invention is described herein with reference to the architecture and fabrication of one pixel cell, it should be understood that this is representative of a plurality of pixel cells in an array of an imager device such as array 240 of imager device 308 (FIG. 1). In addition, although the invention is described below with reference to a CMOS imager, the invention has applicability to other solid state imaging devices having pixel cells. The following detailed description is, therefore, not to be taken in a limiting sense, and the scope of the invention is defined only by the appended claims.

Figure 5:
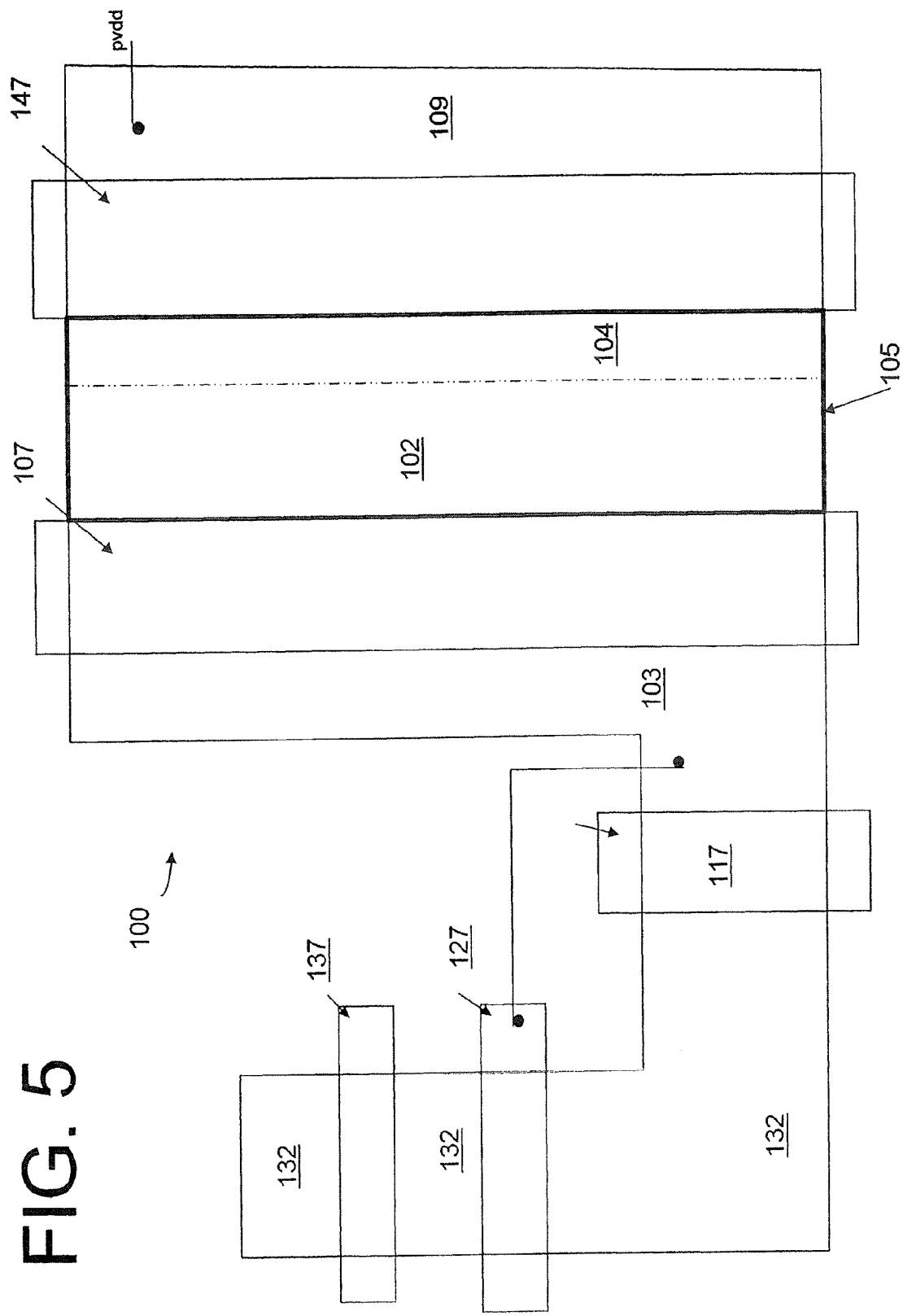
FIG. 5 is a top plan view of an exemplary pixel cell according to a first exemplary embodiment of the invention.
Figure 6:
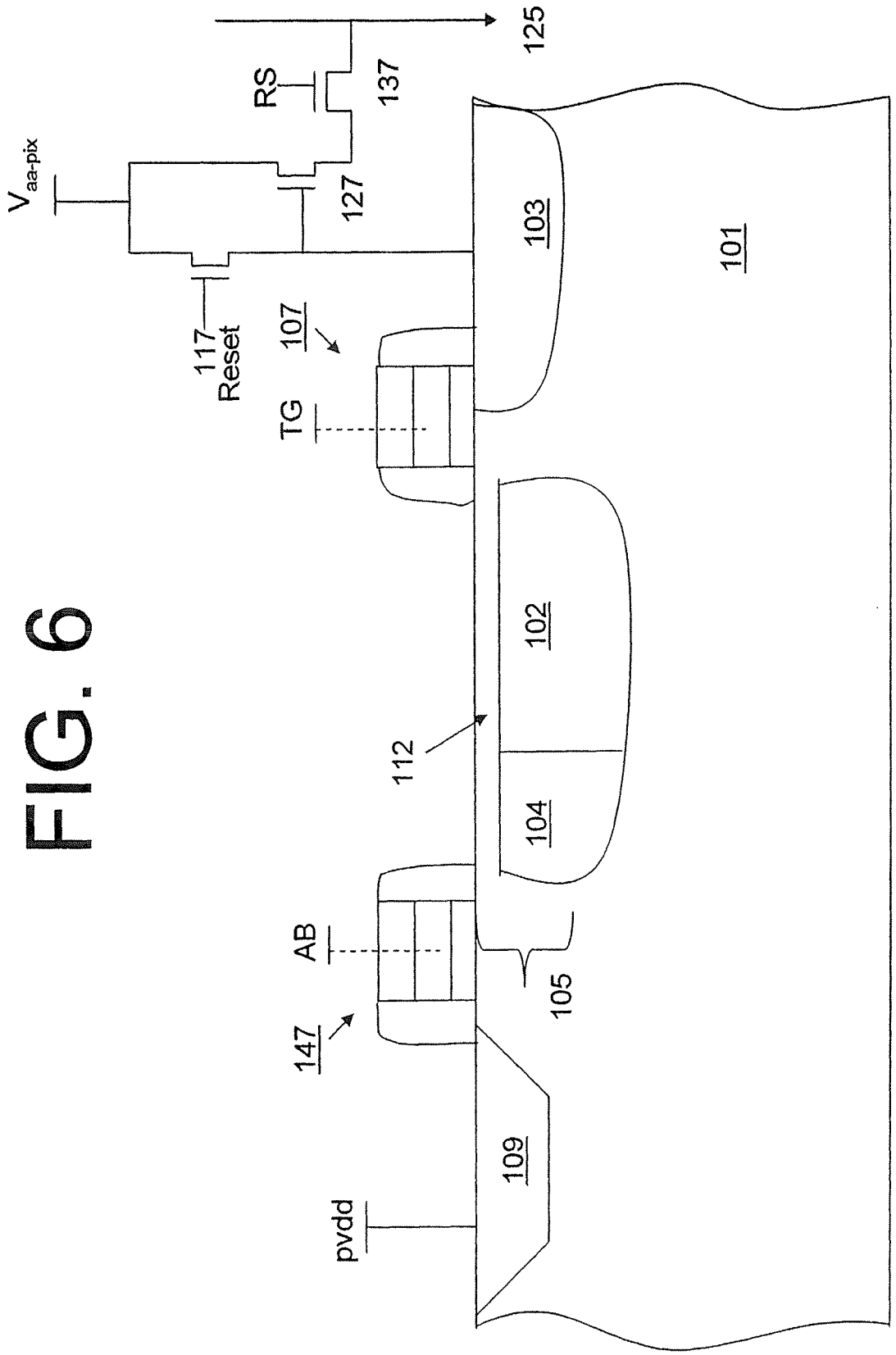
FIG. 6 is a cross-sectional view of the exemplary pixel cell of FIG. 5.

Referring now to the drawings, where like elements are designated by like reference numerals, FIGS. 5 and 6 illustrate an exemplary pixel cell 100 of the invention. FIG. 5 illustrates a top-down view of the pixel cell 100, and FIG. 6 is a cross-sectional view of part of the pixel cell 100 of FIG. 5. The pixel cell 100 has a higher dynamic range than a conventional pixel cell 10, and the pixel cell 100 has a low fixed pattern noise, due to the controlled implanting of two charge accumulation regions 102, 104, providing the pixel photosensor (photodiode 105) with two pinned voltages, as discussed herein. In fact, a pixel cell in accordance with the embodiments described herein may operate with a dynamic range with more than 20 dB higher than that of conventional image pixel operation. A dynamic range of at least 90 dB is possible for exemplary pixel cells constructed in accordance with this invention.

The pixel sensor cell 100 is a five transistor (5T) cell formed over a semiconductor substrate 101. For exemplary purposes, the substrate 101 is lightly doped p-type. The pixel sensor cell 100 has a transfer transistor 107, a reset transistor 117, a source follower transistor 127, a row select transistor 137, and an anti-blooming (AB) transistor 147. The pixel sensor cell 100 has a pinned diode region 105 which includes two adjacent, doped accumulation regions 104, 102 and a surface region 112. Additionally, the pixel sensor cell 100 has a drain region 109 for the AB transistor 147; the drain region 109 is illustratively doped n+ type.

During a first portion of a charge integration period accumulation region 102 stores charge and region 104 sets a barrier for saturation charges to spill over through the AB transistor 147 to a drain region 109. A first charge transfer takes place through transfer transistor 107, and accumulated charges are passed to floating diffusion region 103 and are readout. Thereafter, the AB transistor 147 is turned off and charges accumulate both in accumulation regions 102, 104 and this charge is transferred through transistor 107 to floating diffusion region 103 and is readout.

The doped accumulation regions 102, 104 are both n-type; however, the two regions 102, 104 have different pinned voltages. The first doped region 102, nearest the transfer transistor 107, has a first pinned voltage $V_{pin1}$ and is doped to a first dopant concentration $n_1$. The second doped region 104, nearest the AB transistor 147, has a second pinned voltage $V_{pin2}$ and is doped to a second dopant concentration $n_2$. $n_1$ is a more negative concentration than $n_2$ and accordingly, $V_{pin1}$ is a higher pinned voltage than $V_{pin2}$. Typically, $n_1$ is doped to approximately $1.5\ e^{17}$ atoms per $cm^3$; and $n_2$ is doped to approximately $1.2\ e^{17}$ atoms per $cm^3$. Through implanting, the pinned threshold voltages $V_{pin1}$, $V_{pin2}$ can be controlled as desired.

When exposed to light, the pinned diode region 105 converts photons to charge. The timing of the operation of the FIG. 6 embodiment will be described in greater detail with reference to FIGS. 7, 8, and 15. The charge is then transferred through the transfer transistor 107, when the transistor 107 is turned on, to the floating diffusion region (storage node) 103. The charge is stored in the floating diffusion region 103 until it is read out. The floating diffusion region 103 is electrically connected to the gate of the source follower transistor 127 for the readout operation. The reset transistor 117 is also connected to the floating diffusion region 103, and is used to reset the charge of the diffusion region 103. In the illustrated exemplary embodiment, the floating diffusion region 103 is lightly doped n-type. The pixel cell 100 also has a row select transistor 137, which connects the output of source follower transistor 127 to an associated column line 125 of a pixel array.

Figure 8:
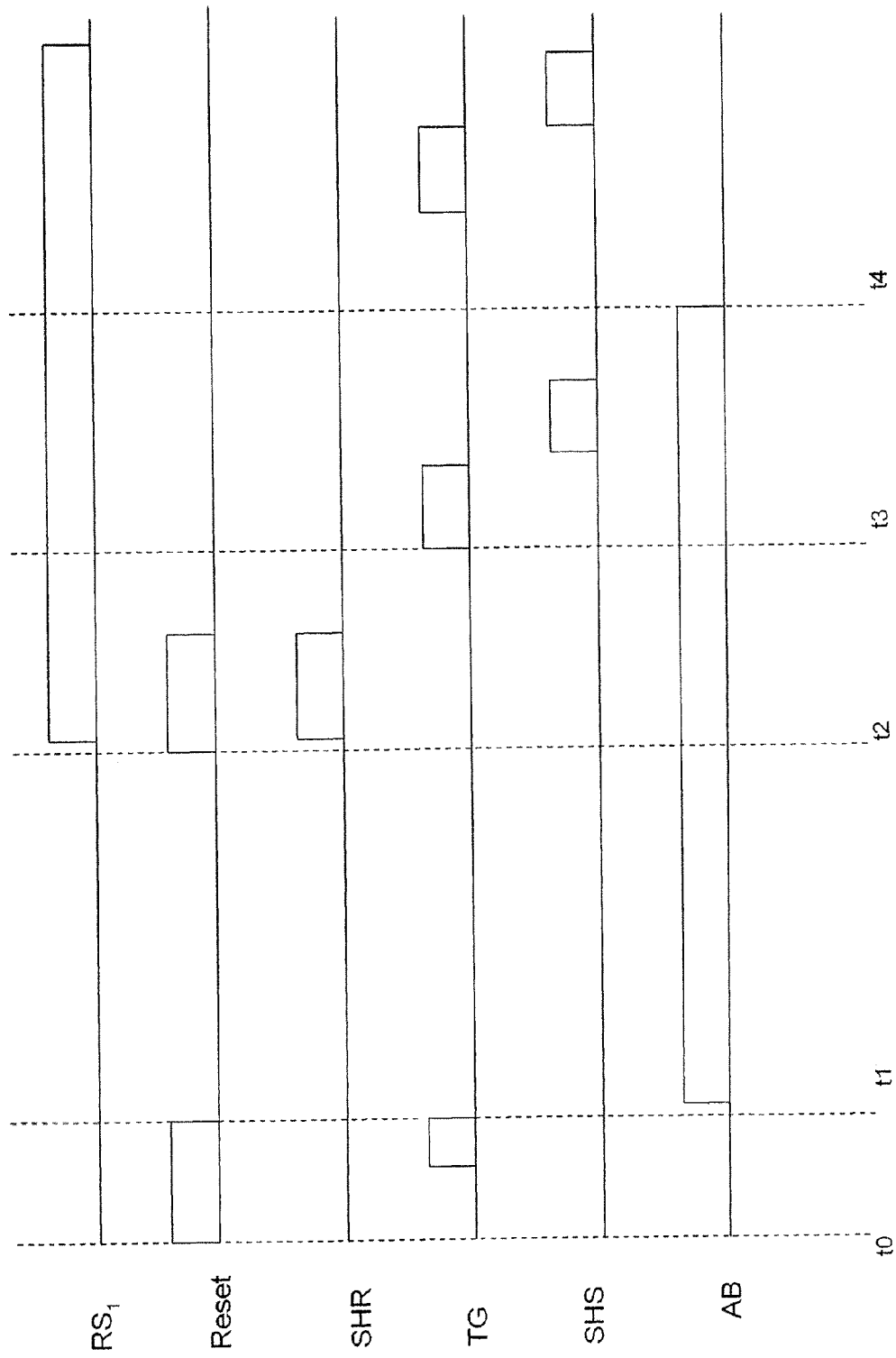
FIG. 8 is a timing diagram for operating the pixel cell of FIG. 5.

FIG. 8 illustrates an exemplary method of operating the pixel cell 100. It should be understood that the exemplary pixel cell 100 is representative of one cell in an array of pixel cells 240 of an imaging device 308, as illustrated in FIG. 1. Thus, the pixel cell 100 of FIG. 6 operates in a circuit, like that shown in FIG. 1, as described herein. Accordingly, the timing and control signals illustrated in FIG. 6 are initiated by a control circuit 250.

At time $t_0$, a reset signal (RESET) is set high to activate the reset transistor 117 and a transfer signal (TG) is also pulsed high to activate the transfer transistor 107. Any charge in the photodiode region 105 is thus reset by being drained through the transfer transistor 107 and reset transistor 117 to the supply voltage $V_{aapix}$. This marks the beginning of a charge integration period for the photosensor 105, illustratively at time $t_1$ when both the RESET and TG signals return to low. As an alternative to resetting the photosensor 105 utilizing the reset 117 and transfer 107 transistors, a mechanical shutter (not shown) can be closed and opened to control the light reaching the photodiode. Accordingly, the integration period of the photosensor would begin when the shutter is opened to allow the photodiode region 105 to receive light and, in response, to begin generating charges.

During the charge integration period, the AB transistor gate signal (AB) is high, thus, the AB transistor 147 is on. At this time, however, anti-blooming control is set by the pinning voltage of accumulation region 104 which creates a higher potential barrier than that of region 102. Accordingly, region 104 can more precisely set the ant-blooming set point such that all pixels of an array have the same anti-blooming set point.

After charge starts integrating in the accumulation regions 102, 104 of the photodiode region 105, the floating diffusion region 103 is reset by again turning the reset signal (RESET) to high. Row select ($RS_1$) and sample and hold (SHR) signals are set high to readout a reset sample signal $V_{rst}$ at the reset condition of the floating diffusion region 103, illustratively at $t_2$. Next, at a time $t_3$ the signal TG is pulsed high again turning on the transfer transistor 107 to transfer charges from the photodiode region 105 to the floating diffusion region 103. A sample and hold signal (SHS) is pulsed high to sample a signal based on the charge on the floating diffusion region 103 as $V_{sig1}$. At a time $t_4$ the AB transistor gate signal is set low, turning off the anti-blooming transistor. As the photodiode region continues to accumulate more charge, a second transfer and readout of charge from the floating diffusion region 103 can be performed, this time sampling a second output signal $V_{sig2}$. After completion of readouts, all signals are returned to low; and the sequence of steps is repeated row-by-row for each pixel cell 100 of the array.

Figure 7:
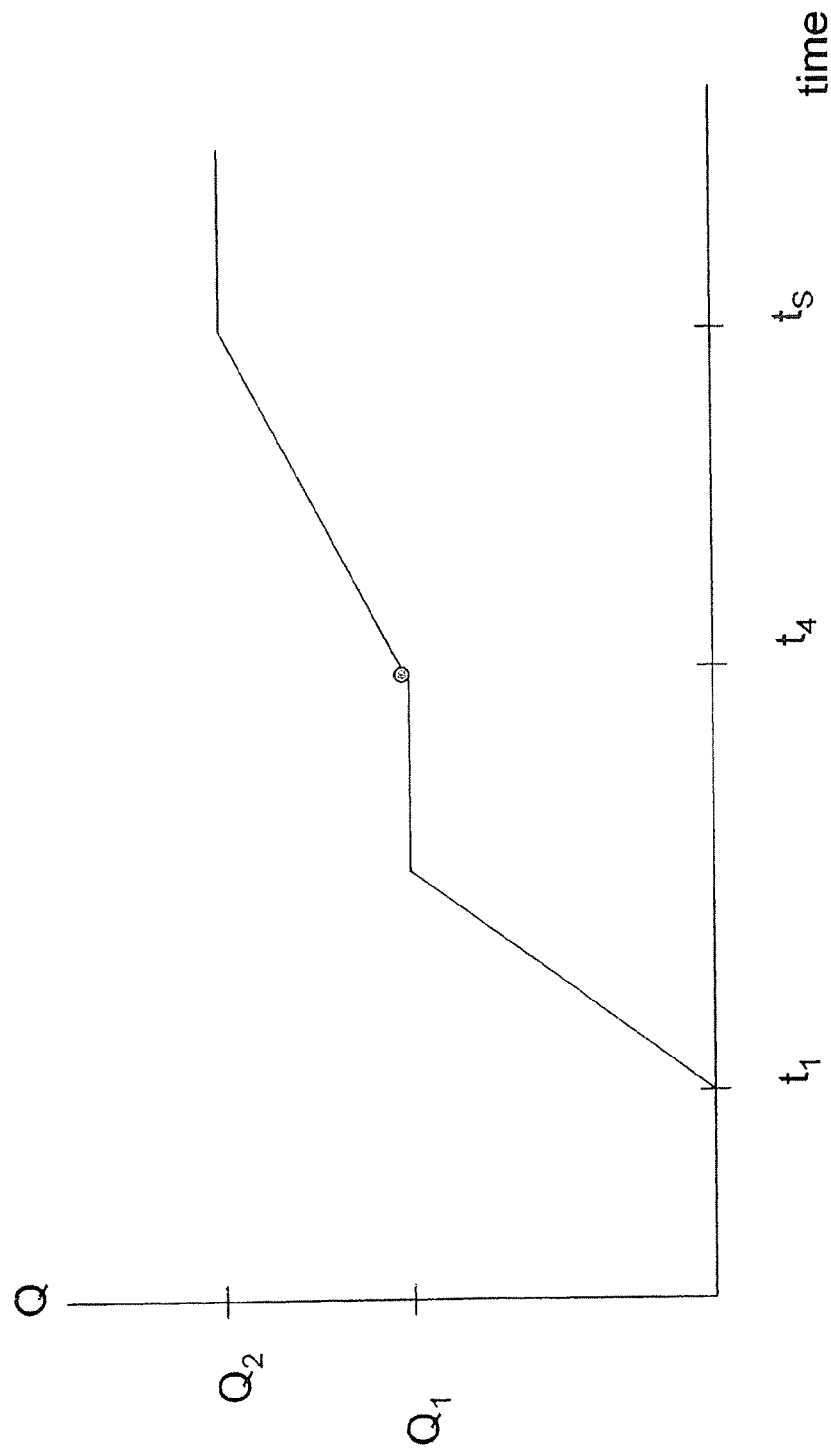
FIG. 7 is a chart of charge versus time for the exemplary pixel cell of FIG. 5.
Figure 15:
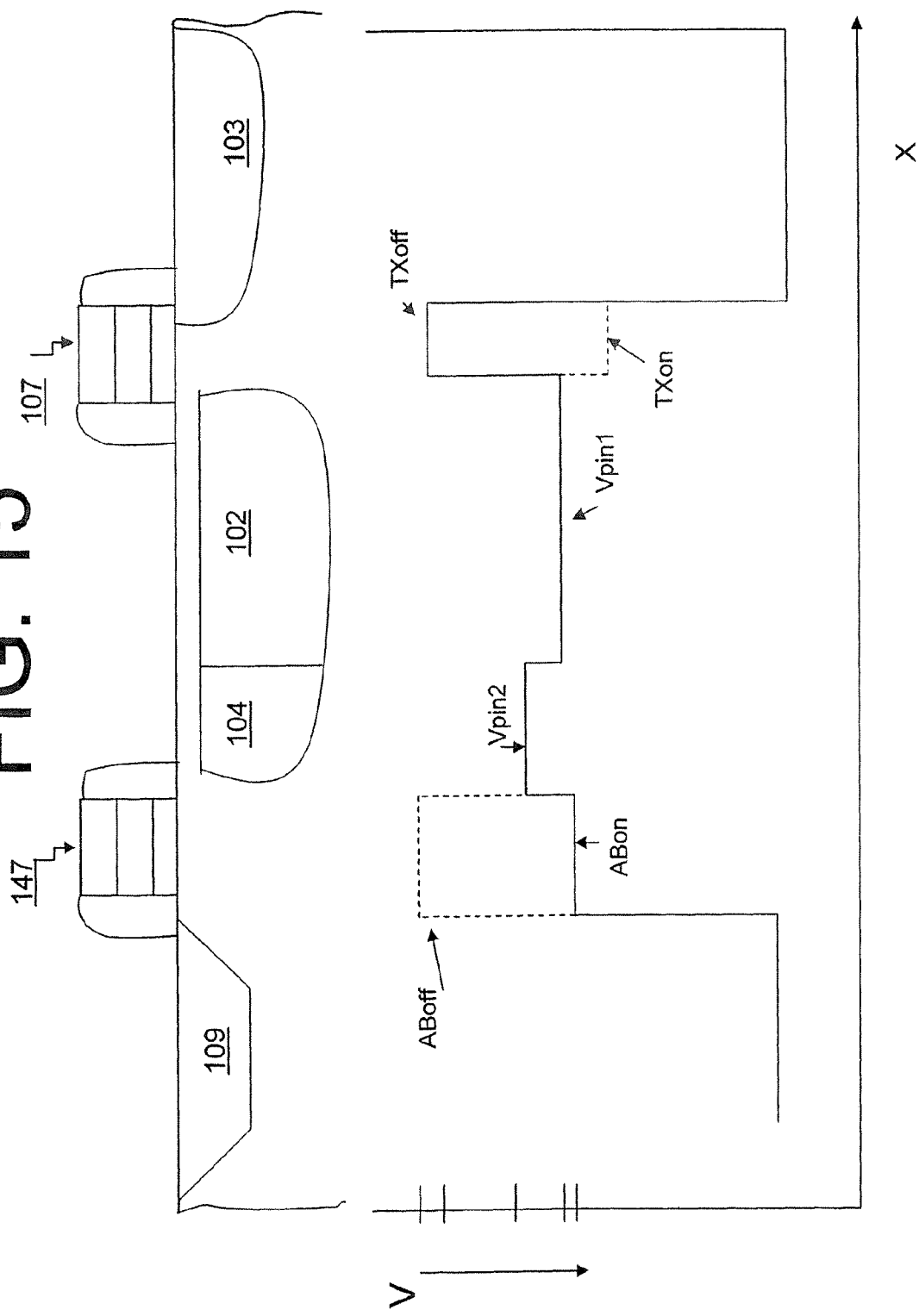
FIG. 15 shows a cross-sectional view of a pixel cell according to one of the exemplary embodiments of the invention and an associated charge-potential diagram.

The increased dynamic range and anti-blooming set point of the pixel sensor cell 100 can be seen in FIG. 7, which illustrates the accumulated charge ("Q") versus time for the pixel sensor cell 100, and in FIG. 15 which is a potential diagram for the exemplary pixel cell 100. When the integration period for the pixel cell 100 begins at time $t_1$, charges are generated and begin to accumulate in the doped accumulation region 102. As shown in FIG. 15, once the first accumulation region 102 accumulates sufficient charges to overcome the potential barrier set by the pinned voltage of the second accumulation region 104, a spillover begins into the second accumulation region 104. During spillover, excess charges in the photodiode region 105 flow from the second accumulation region 104 and through the turned "on" AB transistor 147 into the drain region 109. As such, when the AB transistor is in an on state ($AB_{on}$), it sets a lower potential barrier than either accumulation region 102, 104. Thus, a controlled charge $Q_1$, is maintained in the photodiode region 105 and is characterized by the pre-determined barrier set by the pinned voltages $V_{pin1}$ of the first accumulation region 102 and $V_{pin2}$ of the second accumulation region 104. At time $t_4$ the AB transistor 147 is turned off ($AB_{off}$), creating a large potential barrier (FIG. 15) preventing charge transfer to drain region 109 and more charges accumulate in the regions 102, 104 of photodiode 105, up to a level $Q_2$.

It should be noted that the AB transistor 147 may be omitted, and region 104 directly coupled to the drain region 109 in which case the pixel cell 100 will still have a horizontal anti-blooming effect. If during light exposure, the region 102 gets saturated, the excessive charges have a path from the area of higher pinned voltage, accumulation region 102, through the area having a lower pinned voltage, accumulation region 104, and into the drain region 109. The advantageous effect of the two accumulation regions 102, 104 having different pinned voltages is an accurate barrier set point at which anti-blooming occurs. Thus, an accurate readout of the charges accumulated in region 102 does not depend on the threshold voltage of the AB transistor 147, which tends to vary from pixel to pixel. Instead, the anti-blooming set point is set by the dual pinned voltages of the accumulation regions 102 and 104, which can be more precisely controlled by implantation for every pixel of a pixel array 200.

Figure 9:
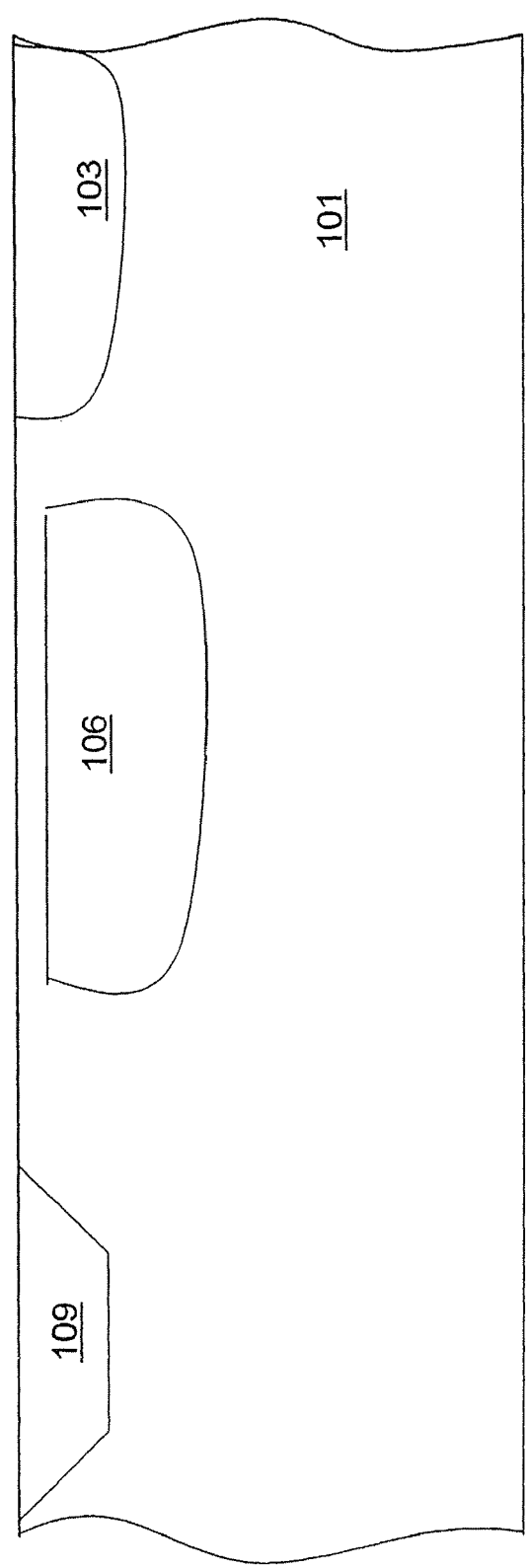
FIG. 9 is a cross-sectional view of the exemplary pixel cell of FIG. 5 at an initial stage of fabrication.
Figure 10:
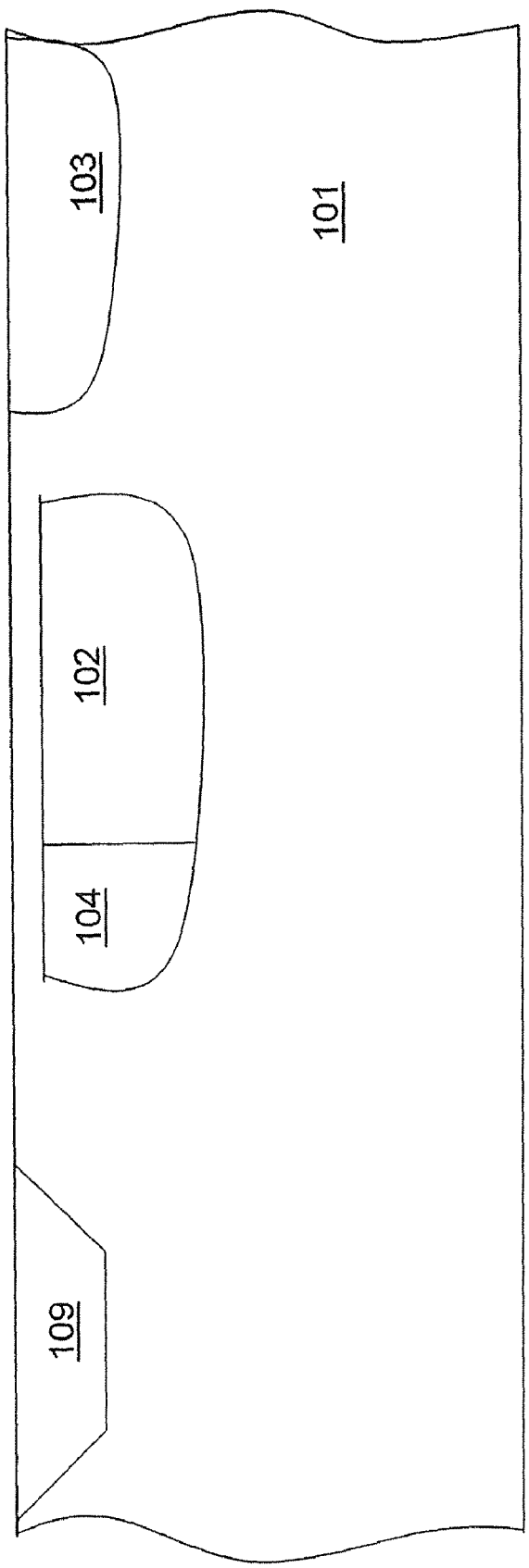
FIG. 10 is a cross-sectional view of the exemplary pixel cell of FIG. 5 at a stage of fabrication subsequent to FIG. 9.
Figure 11:
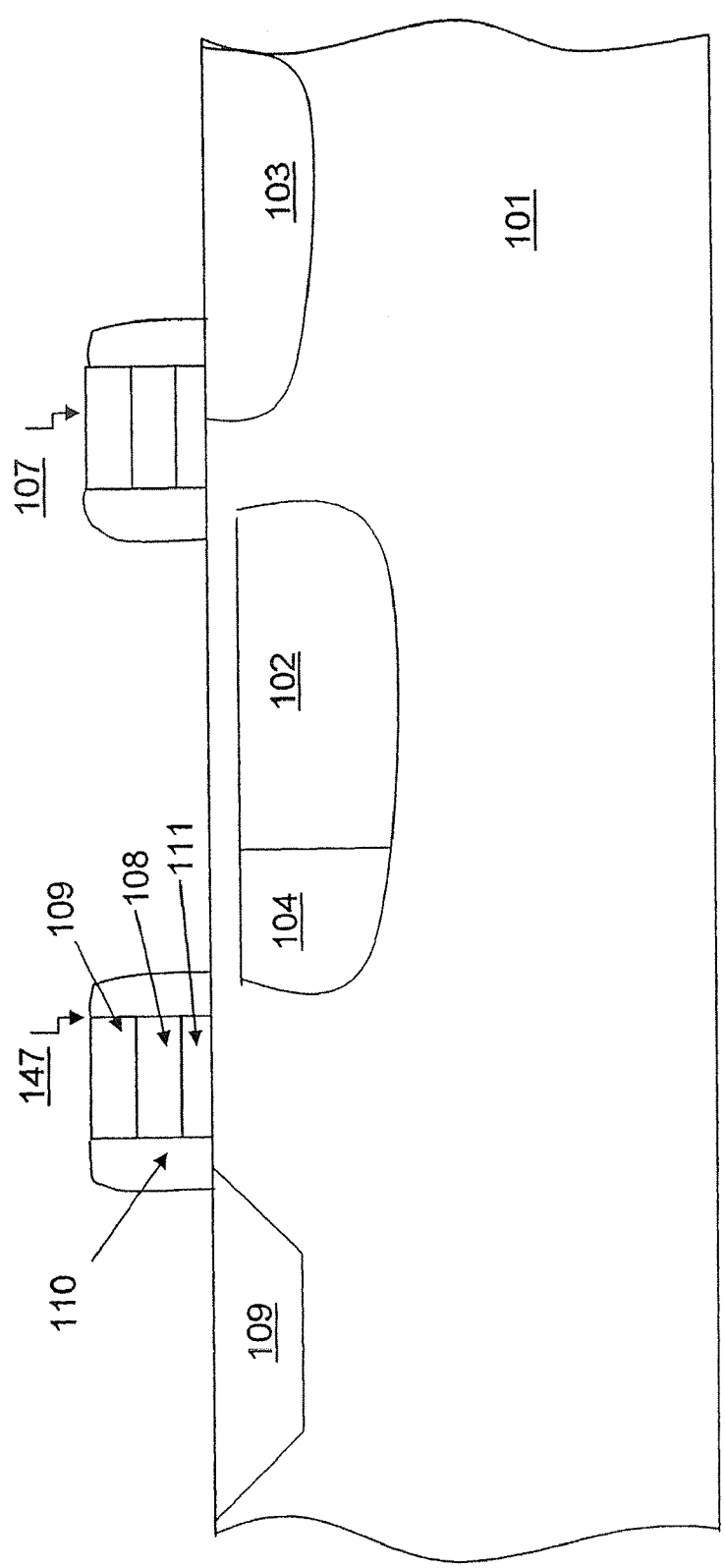
FIG. 11 is a cross-sectional view of the exemplary pixel cell of FIG. 5 at a stage of fabrication subsequent to FIG. 10.

FIGS. 9-11 show an exemplary method of forming the pixel cell 100 according to a first embodiment of the invention. Referring now to FIG. 9, a semiconductor substrate 101 is lightly doped p-type by implanting boron ions, using conventional techniques. Next, a floating diffusion region 103 and drain region 109 are created by lightly doping these regions n-type by implanting an appropriate donor ion, such as arsenic, antimony, or phosphorus, into the semiconductor substrate 101. The drain region 109 preferably has a high concentration of dopants, approximately $5\,e^{18}$ atoms per $cm^3$. Next, a first masked implant is performed to implant donor ions to a first concentration in a region 106. This first concentration is preferably about $1.0\,e^{17}$ atoms per $cm^3$ to about $1.4\,e^{17}$ atoms per $cm^3$.

As shown in FIG. 10, part of the region 106 is subject to a second masked implantation of donor ions is performed to create two distinct doped, accumulation regions 102, 104. The illustrated accumulation regions 102, 104 are contiguous on one side and are also implanted to an equivalent depth in the substrate 101. Utilizing controlled masking techniques for implantation allows these two accumulation regions 102, 104 to be formed as desired. The second masked implant increases the concentration of n-type ions in the accumulation region 102 in a well-controlled manner. As discussed above, the concentration of this accumulation region 102 is preferably about $1.5\,e^{17}$ atoms per $cm^3$. The other accumulation region 104 maintains its dopant ion concentration from the first implantation step (preferably about $1.2\,e^{17}$ atoms per $cm^3$). A p-type surface region 112 (FIG. 6) may be formed between the accumulation regions 102, 104 and the surface of the substrate 101, by performing a masked implant with any suitable p-type dopant.

The gate stacks of the pixel's five transistors are next formed, although for clarity purposes, only the anti-blooming (AB) and transfer transistors 147, 107 are shown in FIG. 11 consistent with the FIG. 6 depiction. For ease of construction, the AB transistor 147 may be formed simultaneously with each of the other transistors, using conventional methods of fabrication and using known transistor gatestack materials. For example, the illustrated gatestacks include three layers, a gate oxide layer 111, a gate conductive layer 108 and a gate top insulating layer 109, either selectively deposited or deposited over the entire substrate 101 surface and selectively etched. Insulating sidewalls 110 are formed of either a nitride or an oxide on the sides of each formed gatestack. It should be understood that other methods and materials may be used to form the transistors, and practicing the invention is not limited to the steps and materials just described.

At this stage, the formation of the exemplary pixel sensor cell 100 is essentially complete. Additional processing steps may be used to form insulating, photo device shielding, and interconnect metallization layers as desired. For example, an inter-layer dielectric (ILD) may be formed over and between the transistors of the pixel sensor cell 100 in order to provide adequate insulation between conductive metallization layers formed above the adjacent pixel cells. In order to maintain a high level of quantum efficiency of the pixel cell 100 of the invention, the metallization may be routed around the photosensors or transparent metallization layers may be used, so that light is not blocked from the photosensors. Conventional layers of conductors and insulators (not shown) may also be used to interconnect the structures and to connect the pixel to peripheral circuitry.

Figure 12:
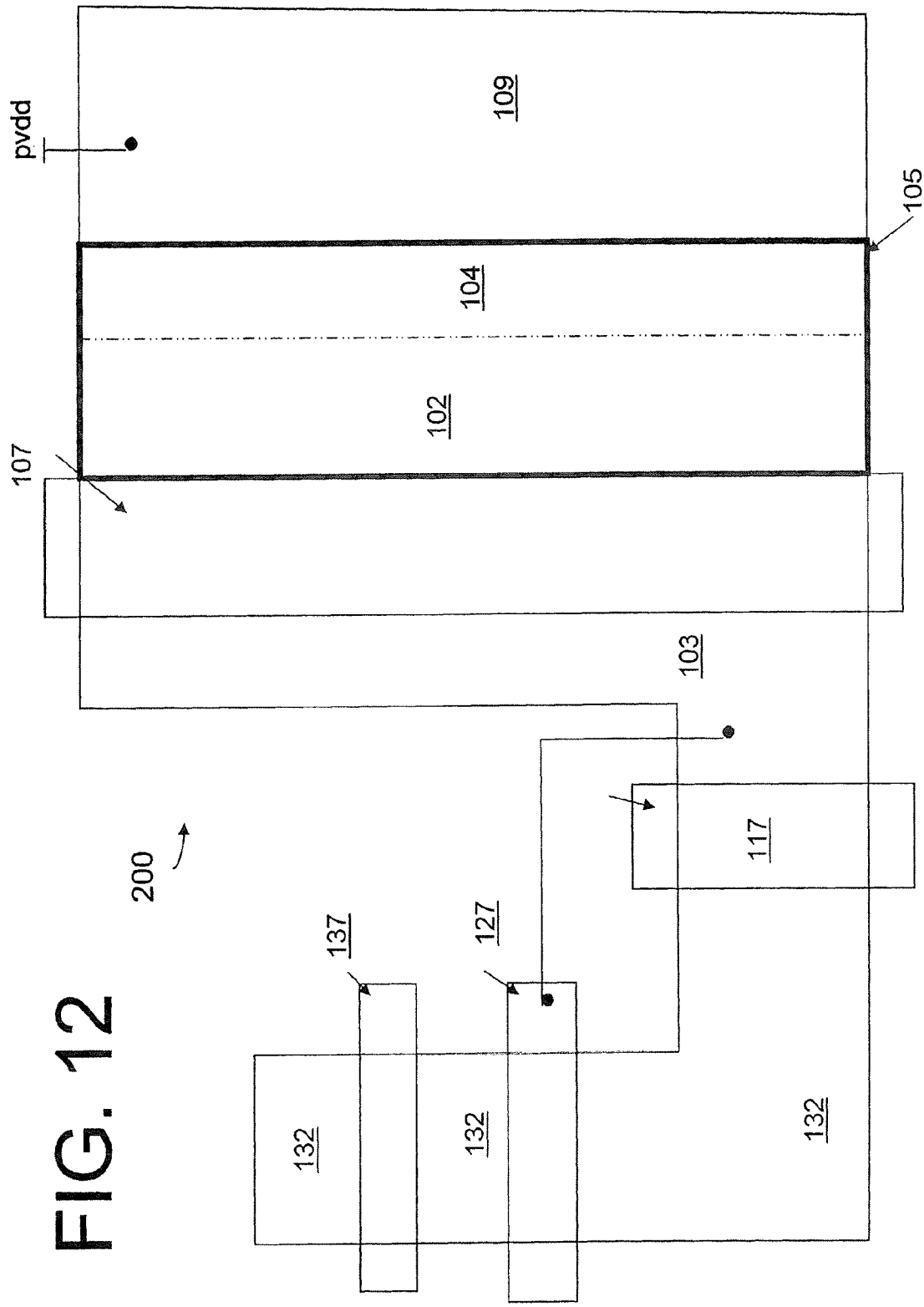
FIG. 12 is a top plan view of an exemplary pixel cell according to a second exemplary embodiment of the invention.

FIG. 12 illustrates in a top down view a pixel cell 200 according to a second exemplary embodiment of the present invention. The exemplary pixel cell 200 is identical to the exemplary pixel cell 100, described above, except that pixel cell 200 does not have the AB transistor 147. Instead, the illustrated pixel cell 200 utilizes the second pinned accumulation region 104 to allow excess charges to flow from the photodiode region 105 to the drain region 109. Similar to the exemplary pixel cell 100, this pixel cell 200 effectively reduces variations in blooming effect of excess charges draining from the photodiode region 105 onto adjacent pixel cells. Each of the illustrated elements of pixel cell 200 may be formed as discussed above with reference to pixel cell 100, except that no AB transistor is formed and the accumulation region 104 abuts the drain region 109.

In FIG. 12, the wide dynamic operation can be obtained as follows: during the first presumably long integration time, charges (in the same way as illustrated in FIG. 7 and FIG. 15) are integrated in the pinned diode 105, which is defined by Vpin1 and Vpin2. Excessive charges (beyond the capacity of the pinned diode 105) spill over drain side 109. After the first exposure, the charges remaining in diode 105 are transferred into the floating diffusion region 103 by turning on transfer gate 107 to high (TG), thus leaving empty pinned diode capacity and allowing for more charge accumulation. The transfer gate signal (TG) is then turned low. A second integration time follows, presumably a shorter period than the first integration time, and the accumulated charges are transferred into floating diffusion region 103 again over transfer gate 107, as just described. This integration and transfer time cycle can be performed several times. After completion of integration of electron charge in the photodiode 105, the readout sequence follows. First, row select (RS) and sample and hold (SHS) are set high to readout a signal from the floating diffusion region 103. Then the reset signal turns high (RESET) turning on the reset transistor 117, and SHR is set to high to readout the reset signal.

Figure 13:
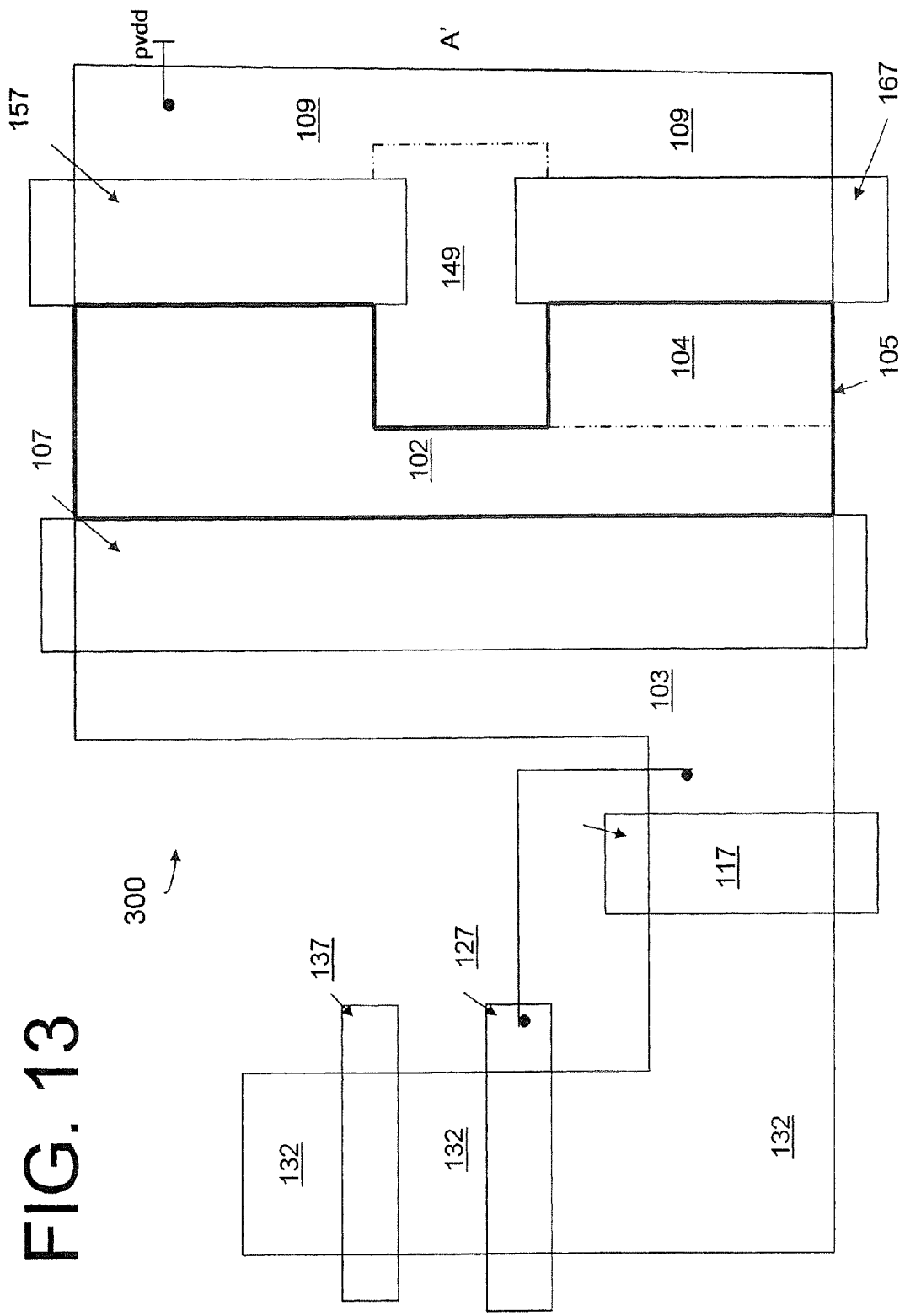
FIG. 13 is a top plan view of an exemplary pixel cell according to a third exemplary embodiment of the invention.

FIG. 13 illustrates in top down view a pixel cell 300 according to a third exemplary embodiment of the present invention. The exemplary pixel cell 300 is similar to the pixel cell 100 (FIGS. 5 and 6), described above, except that the pixel cell 300 utilizes two AB transistors 157 and 167. The pixel cell 300 also has two pinned accumulation regions 102, 104 (having the dopant concentrations and other characteristics described above). The first accumulation region 102 is electrically connected to the first AB transistor 157, and the second accumulation region 104 is electrically connected to the second AB transistor 167. Both AB transistors 157, 167 drain into the drain region 109.

Figure 3:
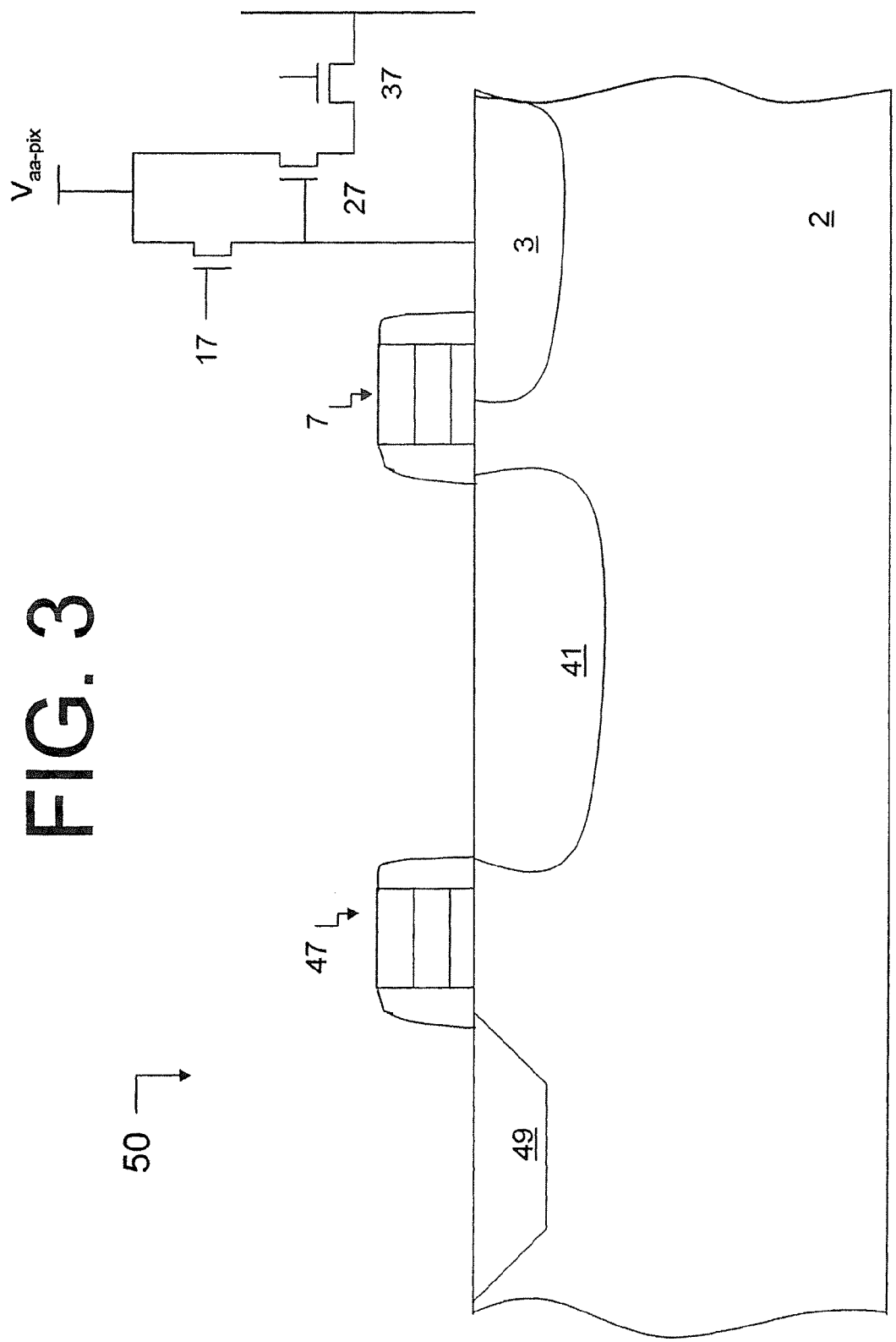
FIG. 3 is a schematic diagram of a five-transistor (5T) pixel cell which includes an anti-blooming transistor.
Figure 4:
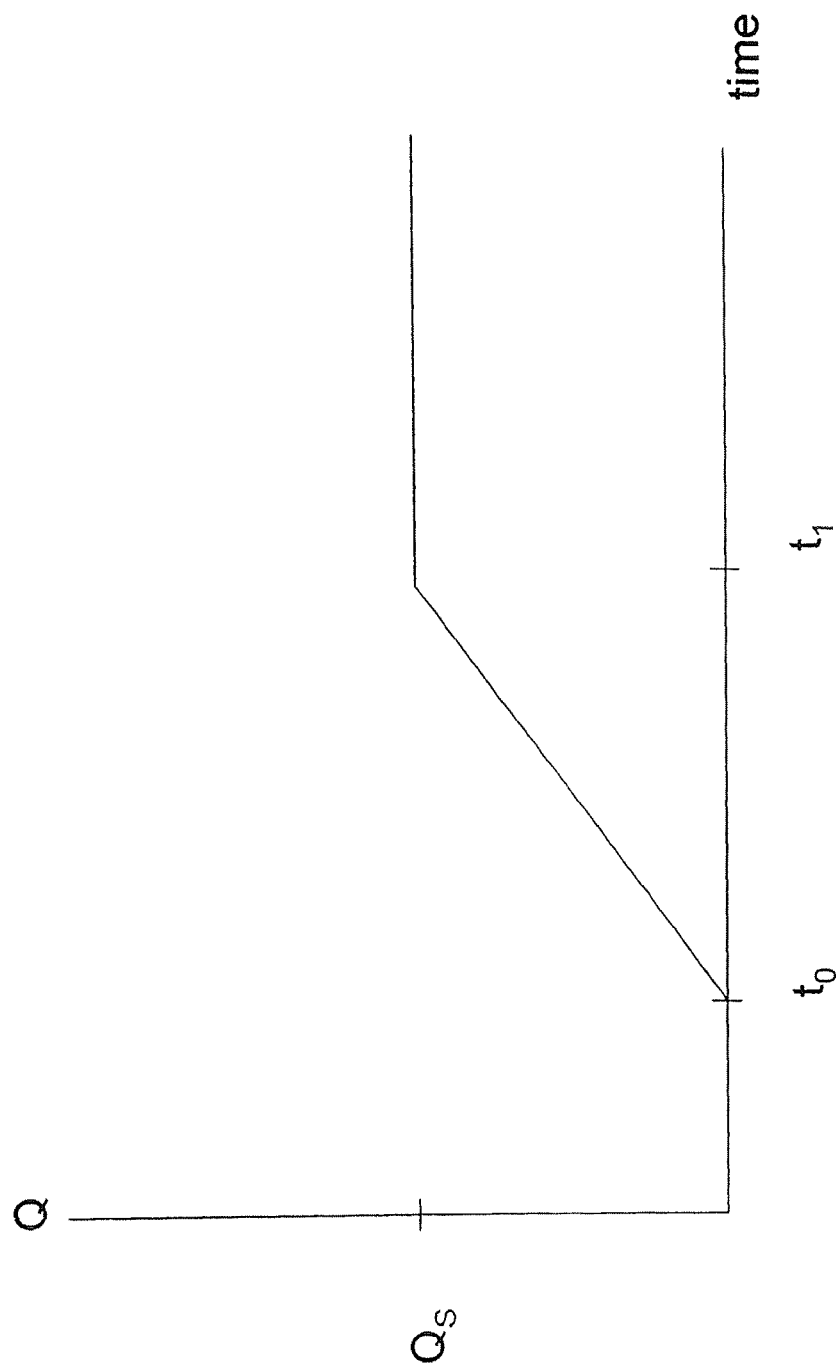
FIG. 4 is a chart of charge versus time for a conventional 4T pixel cell.

Utilizing the accurate implanting steps as discussed above with reference to FIGS. 9-10, creates two, controlled paths for excess charges generated in the first accumulation region 102. For example, excess charges may flow from the first accumulation region 102 through the first AB transistor 157 and into the drain region 109 much like the conventional pixel structure of FIG. 3. Alternatively, excess charges may flow from the first accumulation region 102 into the second accumulation region 104 and eventually through the second AB transistor 167, into the drain region 109. The two AB transistors 157, 167 are well insulated by an oxide material formed on the surface of the substrate to create an isolation region 149, as seen in FIG. 13. An added degree of flexibility of operation of the pixel is provided by pixel cell 300. Another benefit of the exemplary pixel cell 300 is that the first AB transistor 157 may act as a reset for the photodiode region 105. Thus, charge readout of the floating diffusion region 103 can take place simultaneously with the reset of the photodiode 105.

Figure 14:
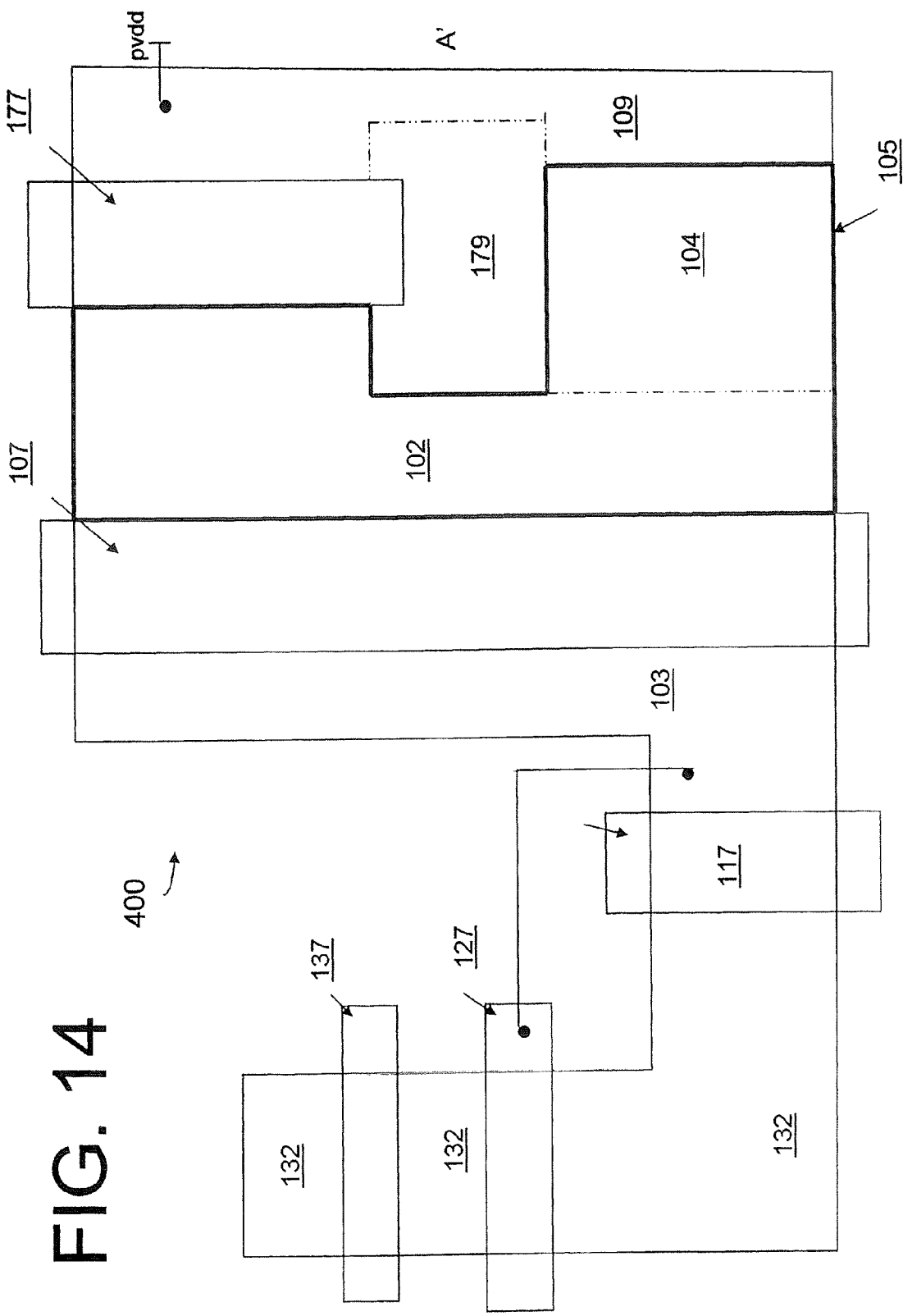
FIG. 14 is a top plan view of an exemplary pixel cell according to a fourth exemplary embodiment of the invention.

FIG. 14 illustrates in top down view a pixel cell 400 according to a fourth exemplary embodiment of the invention. The exemplary pixel cell 400 is similar to the exemplary pixel cell 100 (FIGS. 5 and 6), except for the placement of the AB transistor 177 (compared with 147 of pixel cell 100). The AB transistor 177 is electrically connected to only the first accumulation region 102; the AB transistor 177 is isolated from the second accumulation region 104 by an isolation region 179. The isolation region 179 is typically a surface oxide layer. Thus, excess charges that are generated in the first accumulation region 102 may travel to the drain region 109 through either of two paths. The first path is through the AB transistor 177. The second path (which can be controlled by the accurate pinned voltages achieved during implantation of dopants in the accumulation regions 102, 104) is through the second accumulation region 104.

The second through fourth exemplary embodiments of this invention are constructed using similar fabrication steps discussed above with reference to FIGS. 9-11. The implanted donor concentrations for the two accumulation regions 102, 104 and drain region 109 are preferably the same as discussed above, with only the location of the regions being different. The location of the accumulation regions 102, 104 is easily achieved using known, selective implanting techniques.

Although the above embodiments have been described with reference to the formation of n-type accumulation regions in a p-type substrate, the invention has equal applicability to p-type accumulation regions in n-type substrates. Of course, the dopant and conductivity type of all structures will change accordingly. Additionally, it should be understood, that the present invention is not limited to the semiconductor substrate 101 structure illustrated. In fact, the present invention could be practiced with alternative designs, for example, as a p-type epitaxial layer grown over a semiconductor substrate or as an SOI structure.

The exemplary pixels of the present invention can be used in a pixel array 240 of the imager device 308 shown in FIG. 1 and described above. FIG. 16 illustrates a processor-based system 1100 including an imaging device 308, which has pixels constructed in accordance with the methods as described herein. For example, pixels may be any of the exemplary pixel cells 100, 200, 300, 400 in accordance with the exemplary embodiments of the invention described above. The processor-based system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 1100, for example a camera system, generally comprises a central processing unit (CPU) 1102, such as a microprocessor, that communicates with an input/output (I/O) device 1106 over a bus 1104. Imaging device 308 also communicates with the CPU 1102 over the bus 1104, and may include a CMOS pixel array having any one of the exemplary pixels 100, 200, 300, or 400 as discussed above. The processor-based system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor. Any of the memory storage devices in the processor-based system 1100 could store software for employing the above-described method.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be con-

What is claimed as new and desired to be protected by Letters Patent of the United States is:

1. A method of operating a wide dynamic range pixel cell, the method comprising:
   resetting a photosensor to remove all charge from the photosensor by setting a reset signal to activate a reset transistor and pulsing a transfer signal to activate a transfer transistor, the photosensor comprising first and second charge accumulation regions having respective first and second pinned voltages;
   exposing the photosensor to light during an integration period, the photosensor capable of converting the light into charges;
   draining said charges from said first accumulation region into said second accumulation region;
   setting an anti-blooming transistor to drain excess charge from the second charge accumulation region into a drain region; and
   performing a readout of the charges generated by the photosensor during the integration period, wherein a set point of the anti-blooming transistor is set by the respective first and second pinned voltages of the first and second charge accumulation regions.

2. The method of claim 1, further comprising the step of a first transfer of generated charges from the photosensor to a floating diffusion region.

3. The method of claim 2, further comprising the step of second transfer of charges accumulated since said first transfer, from the photosensor to said floating diffusion region.

4. The method of claim 3, wherein said readout of said charge comprises:
   performing a first readout of charges from said floating diffusion region after said first transfer; and
   performing a second readout of charges from said floating diffusion region after said second transfer.

5. The method of claim 4, wherein said second readout occurs subsequent to said anti-blooming transistor draining excess charge from said photo sensor.

6. The method of claim 2, wherein performing the readout comprises:
   setting a row select signal and sample and hold signals high to readout a signal from the floating diffusion region;
   turning the reset signal high to turn on the reset transistor; and
   setting a reset sample and hold signal high to readout the reset signal.

7. The method of claim 1, further comprising opening a shutter to expose the photosensor to light during an integration period.

8. The method of claim 1, wherein after completion of performing the readout of the charges, all signals are returned to low and the steps of resetting the photosensor to performing the readout are repeated row-by-row for each pixel cell of an array.

* * * * *